United States Patent [19]

Kida et al.

[11] Patent Number: 4,973,518

[45] Date of Patent: Nov. 27, 1990

[54] MONOCRYSTAL ROD PULLED FROM A MELT

[75] Inventors: Michio Kida, Urawa; Kensho Sahira, Yono; Akikuni Nozoe, Hyogo, all of Japan

[73] Assignee: Mitsubishi Kinzoku Kabushiki Kaisha, Tokyo, Japan

[21] Appl. No.: 178,966

[22] Filed: Apr. 7, 1988

[30] Foreign Application Priority Data

Apr. 9, 1987 [JP] Japan .................................. 62-87463

[51] Int. Cl.⁵ .............................................. D02G 3/00
[52] U.S. Cl. .................................... 428/364; 428/397; 428/399; 428/401
[58] Field of Search ............... 428/399, 397, 364, 401; 156/620.2, 620.3, 620.4, 620.5, 617.1, 618.1, 619.1

[56] References Cited

U.S. PATENT DOCUMENTS 4,289,572  9/1981  Sawyer ............................ 156/620.4
4,417,943  11/1983 Jacques ............................ 156/601

FOREIGN PATENT DOCUMENTS 0094582   9/1974  Japan ............................... 156/620.5
0179096   11/1982 Japan ............................... 156/617.1
62-288191 12/1987 Japan .

OTHER PUBLICATIONS

Extended Abstracts, vol. 82-1, May 1982, pp. 303-304, No. 191, Pennington, N.J., U.S.; K. M. Kim et al.: "Computer Simulation and Controlled Growth of Large Diameter Czochralski Silicon Crystals".

Primary Examiner—George F. Lesmes
Assistant Examiner—Jill M. Gray
Attorney, Agent, or Firm—Cushman, Darby & Cushman

[57] ABSTRACT

A monocrystal rod utilized for producing the semiconductor device or solar cell includes a neck section, a main rod section and a shoulder section. The neck section is smaller in diameter than a seed crystal. The main rod section is formed integrally with the neck section and is larger in diameter than the neck section. The shoulder section is tapered for linking the neck section to the main rod section. The main rod section has a stopper section at the top portion of the main rod section, and the stopper section is larger than the main rod section.

Also, an apparatus for preparing the monocrystal rod has a safety member for supporting upwards the stopper section of the falling monocrystal rod.

Further, a method of preparing the monocrystal rod includes the steps as follows. The seed crystal is pulled out from a melt in a crucible while rotating it. The speed of pulling the seed crystal is at first increased to grow the neck section whose diameter is smaller than the seed crystal, and then is gradually decreased to grow the shoulder section. Subsequently, the pulling speed is increased again so as to prevent further increase in diameter to grow the stopper section at the lower end of the shoulder section or at the top portion of the main rod section, and then is decreased again to grow the main rod section whose diameter is equal to a required diameter.

2 Claims, 2 Drawing Sheets

FIG. 1(Prior Art) FIG. 2
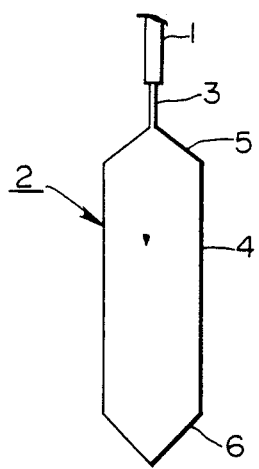
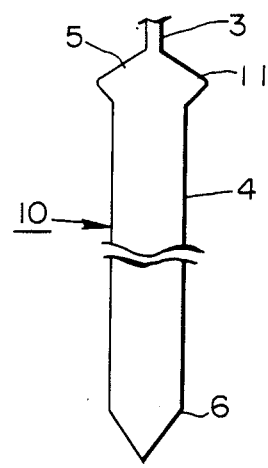
FIG. 3 FIG. 4
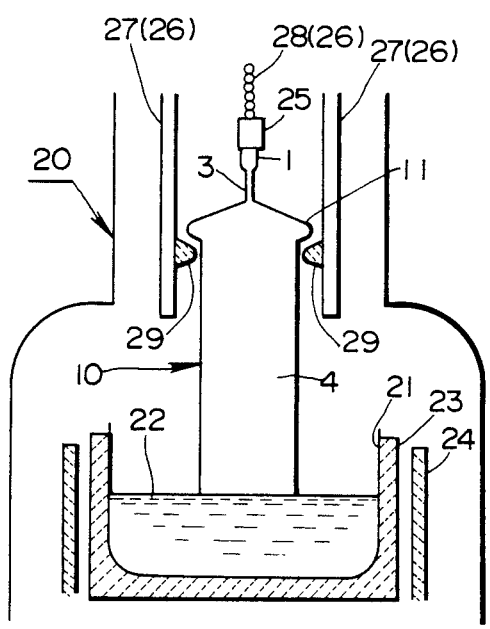
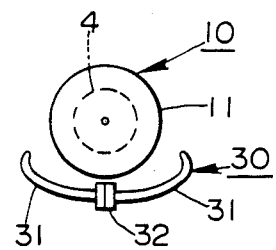
FIG. 5
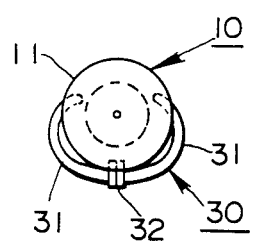

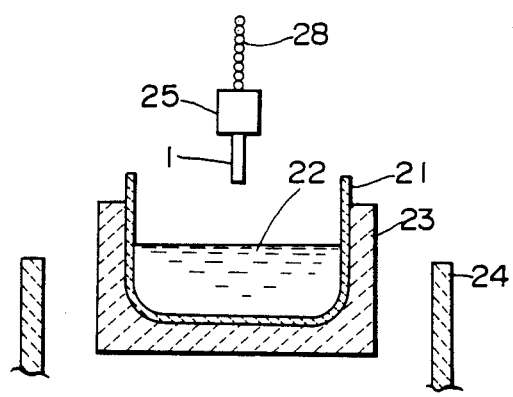
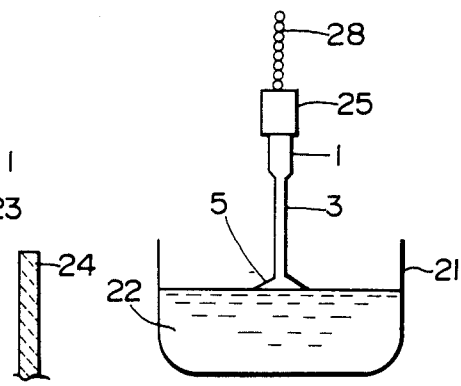
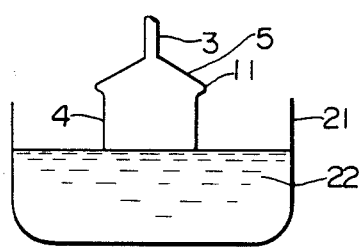
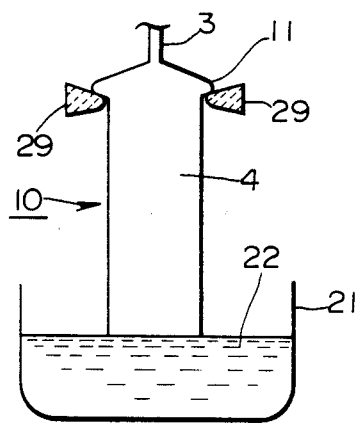

4,973,518

MONOCRYSTAL ROD PULLED FROM A MELT

BACKGROUND OF THE INVENTION

1. Field of the Invention

This invention relates to a monocrystal rod which is utilized for producing semiconductor device, solar cell or the like.

2. Prior Art

Examples of methods extensively used for preparing a monocrystal rod such as a silicon semiconductor or compounds semiconductor include a Czochralski method, which comprises a step of pulling a seed crystal upwards from a melt in a crucible while rotating the seed crystal and the crucible in the same or opposite direction.

FIG. 1 shows an example of a monocrystal rod which is prepared by the method above. Numeral 1 denotes a seed crystal, and numeral 2 denotes a monocrystal rod which has a circular cross section. The monocrystal rod 2 includes a neck section 3 which is smaller in diameter than the seed crystal 1, a main rod section 4 which is cylindrical and whose diameter is the largest in the rod 2 and is equal to the diameter of the required rod, and a shoulder section 5 which is tapered for linking continuously the neck section 3 to the main rod section 4. Numeral 6 denotes a bottom section of the main rod section 4 which is tapered. Only the main rod section 4 in the rod 2 can be used for producing the semiconductor chips or the like, and its diameter is determined depending on the diameter of the required rod. Also, the diameter of the main rod section 4 generally varies slightly depending on the exactness or precision of techniques of controlling the size thereof. Therefore, it is preferably similar to the diameter of the required rod, and the variation in the diameter should be as small as possible in order to efficiently prepare the main rod section 4.

The neck section 3 is provided so as to reduce the dislocation density of the seed crystal 1 prior to pulling up the seed crystal 1 with a predetermined diameter and thus increase the completeness thereof. For example, when the rod 2 is made of silicon semiconductor, the neck section 3 is about 3 to 4 millimeters in diameter and about several ten millimeters in length. In this case, the tensile strength of the neck section 3 is at most about 100 kgw. However, even if the weight of the rod 2 is less than 100 kg, the neck section 3 will often be damaged, with the result that ultimately the rod 2 will fall down when the rod 2 is twisted, or when force is exerted on the rod 2 in its transverse direction. In case the rod 2 falls as the result of rupture of the neck section 3, the apparatus for pulling the rod 2 is damaged fatally, and moreover a security problem comes about because the rod 2 fallen is very heavy and hot. Therefore, the step of pulling the rod 2 needs to be concluded before the weight of the rod 2 grows too heavy for the neck section 3 to endure the breakage or before the tensile strength caused by the weight of the rod 2 becomes close to or above to such an extent that its maximal tensile strength of the neck section 3.

According to a conventional method, the rod 2 is pulled with care so that the weight of the rod 2 will remain at a value considerably below the weight at which the neck section 3 has the maximal tensile strength. When the weight of the rod 2 has reached a predetermined value the pulling operation is stopped and the thus-obtained rod 2 is cut out from the seed crystal 1, and then another rod 2 is pulled upward again with the seed crystal 1. Alternatively, according to another conventional method, the rod 2 is pulled upward while feeding a limited amount of starting silicon material into a melt in a crucible from the beginning with view to avoiding the above-described difficulty.

However, the above-mentioned conventional methods have a defect that the productivity is very low because the length of the rod 2 which can be pulled in a single operational step is limited. Moreover, the availability of the apparatus is very low.

Also, even if the rod 2 is pulled upwards with a sufficient reserve so as to make the weight of the rod 2 below a predetermined value which is determined depending on the mechanical strength of the neck section 3, a possibility cannot be denied that the neck section 3 is damaged and the rod 2 falls down as a result of unexpected causes such as earthquakes, mechanical shocks and the like. On the occasion whose the rod 2 falls, as aforementioned, the lower portion of the expensive apparatus which includes a crucible for containing a melt, a susceptor for surrounding the crucible, heating means for heating the crucible through the susceptor, and a cylinder for keeping warmth of the crucible and the susceptor together will be destroyed.

SUMMARY OF THE INVENTION

Accordingly it is an object of the present invention to provide a monocrystal rod which is heavy and long than the conventional rod.

Another object of the present invention is to provide a monocrystal rod having a stopper section for preventing it from falling, even though force is exerted on the rod in its transverse direction by earthquakes, mechanical shocks and the like, and for preventing the lower portion of an apparatus for preparing the rod from being destroyed.

A further object of the present invention is to provide an apparatus for preparing the monocrystal rod above with elevated availability.

Yet another object of the present invention is to provide a method of preparing the monocrystal rod above with elevated productivity.

According to a first aspect of this invention, there is provided a monocrystal rod including a neck section which is smaller in diameter than a seed crystal, a main rod section which is formed integrally with the neck section and is larger in diameter than the neck section, a shoulder section which is tapered for linking the neck section to the main rod section, and has the same diameter as that of the neck section on one end and has the same diameter as that of the main rod section on the other end, a stopper section provided at the top of the main rod section, the stopper section being larger in diameter than the main rod section.

According to a second aspect of this invention, there is provided an apparatus for preparing a monocrystal rod having a stopper section for preventing it from falling, comprising a crucible for containing a melt, heating means for heating the crucible, supporting means for supporting a seed crystal, and an elevator for elevating the supporting means, the elevator including an outer member having safety means and an inner member for holding the supporting means.

According to a third aspect of this invention, there is provided a method of preparing a monocrystal rod having a stopper section for preventing it from falling, using the apparatus having safety means, comprising:

(a) pulling out the lower end of a seed crystal from a melt in a crucible while rotating the seed crystal and the crucible;

(b) increasing the speed of pulling the seed crystal while maintaining the temperature of the melt at a predetermined level;

(c) decreasing gradually the pulling speed and the temperature of the melt until the diameter of the rod becomes larger than a required diameter;

(d) increasing the pulling speed again until the diameter of the rod becomes similar to the required diameter; and (e) after the diameter of the rod is equal to the required diameter, decreasing the pulling speed again.

BRIEF DESCRIPTION OF THE DRAWINGS

FIG. 1 is a schematic side-elevational view showing a conventional monocrystal rod;

FIG. 2 is a schematic side-elevational view showing a monocrystal rod of the present invention;

FIG. 3 is a side-elevational view in partial cross-section of an apparatus for preparing a monocrystal rod according to the present invention;

FIG. 4 is a partially plan view of safety means or clamp means of an apparatus of the present invention, showing the clamp members of the clamp means in an open position;

FIG. 5 is a partially plan view similar to FIG. 3 but showing the clamp members in the closed position;

FIGS. 6, 7 and 8 are side-elevational view in partial cross-section showing a method of preparing a monocrystal rod according to the present invention; and FIG. 9 is a schematic side-elevational view in partial cross-section of another referred method according to the present invention.

DESCRIPTION OF PREFERRED EMBODIMENTS OF THE INVENTION

Referring to FIG. 2, there is illustrated a monocrystal rod of the present invention. Reference numeral 10 indicates a monocrystal rod. The monocrystal rod 10 made of silicon has a circular cross section, and comprises a neck section 3 which is slender, a main rod section 4 which is cylindrical and is equal in diameter to the required rod, and a shoulder section 5 which is tapered for linking the neck section 3 to the main rod section 4. The tapered bottom section 6 is formed at the bottom portion of the main rod section 4. Also, a stopper section 11, which is formed at the top portion of the main rod section 4, is larger in diameter than the rod section 4, and prevents the rod 10 from falling, or thereby preventing either the breakage of the rod itself or the lower portion of the apparatus for preparing the rod 10 due to shock given by the falling rod 10. As aforementioned, the reason why the stopper section 11 is formed at the top portion of the main rod section 4 is that the stopper section 11 having a larger diameter cannot be easily formed at the middle or the bottom portion of the main rod section 4 since in a step of pulling the main rod section 4, the speed of pulling the main rod section 4 and its temperature need to be kept constant in order to maintain the character and the diameter of the main rod section 4 uniform. Indeed, when one or more of the operational condition such as the speed of pulling the main rod section 4 and the temperature of the melt are changed in order to form the stopper section 11 at the middle or bottom portion of the main rod section 4, the quality of the thus-obtained main rod section 4 becomes poor. In this case, there is another difficult problem in controlling the diameter of the main rod section 4 exactly. On the other hand, with the main rod section 4 having the stopper section 11 at the top portion thereof, the main rod section 4 can if it happens to fall down be supported stably and safely by means of the stopper section 11 and a safety section of an apparatus, because the center of gravity of the rod 10 is situated at a position lower than the stopper section 11 and therefore the tilting of the top of the rod will be minimized, if any. Moreover, the above construction is advantageous in that when the main rod section 4 is being prepared, the stopper section 11 is cooled already, because the stopper section 11 is prepared before the step of pulling the main rod section 4 and therefore its mechanical strength is elevated to a level high enough to support the rod upon its falling.

Also, the maximal diameter of the stopper section 11 is set up by from 6 mm plus the diameter of the main rod section to 6 mm plus the radius of the main rod section 4 as large than the diameter of the main rod section 4. The reason why the maximal diameter of the stopper section 11 is set up so as to be by at least 6 mm larger than the diameter of the main rod section 4 is that when the main rod section 4 is grown until the length of the main rod section 4 becomes 0 to 100 mm, the deviation between the crystallographic axis of the main rod section 4 and the ideal axis thereof often becomes about 1 to 2 mm, and moreover variation in the diameter of the main rod section 4 often becomes about 1 to 2 mm, and that there need be a gap or clearance defined between the safety section and the supporting means of the apparatus to such an extent that the main rod section 4 can be prepared, well and efficiently. Also, the reason why the maximal diameter of the stopper section 11 is set up so as to be by at least 6 mm plus the radius of the main rod section 4 larger than the diameter of the main rod section 4 is that while the stopper section 11 needs to scale up with increase in the weight of the main rod section 4 corresponding the mechanical strength of the stopper section 11 on the occasion where the larger-diameter rod is prepared, the productivity when the stopper section 11 is large is decreased accordingly because the stopper section 11 cannot be utilized for producing the semiconductor chips or the like.

Referring to FIG. 3, there is illustrated an apparatus for preparing the rod 10, as aforementioned, as shown in FIG. 2. Reference numeral 20 denotes an apparatus comprising a quartz crucible 21 which contains a melt 22 made of silicon, a susceptor 23 made of graphite housed in a furnace (not shown) which houses in the crucible 21, heating means 24 such as a resistance heater disposed so as to surround the susceptor 23, supporting means 25 which supports the seed crystal 1, and an elevator 26 including a pair of outer members or shafts 27 and 27 which moves in vertical direction while rotating itself and an inner member or a wire 28 made of metal which moves in vertical direction in a narrow space defined between the shafts 27 and 27. The wire 28 is a member for holding the supporting means 25. The safety means or safety sections 29 and 29 having a substantially U-shaped cross section are mounted on an inner surface of the shafts 27 and 27. The safety sections 29 and 29 are members for surrounding the rod 4 while pulling it and for supporting the rod upwards at the lower end of the stopper section 11 when the neck section 3 is damaged or is cut. In this apparatus, the crucible 21 and the seed crystal 1 are rotated in reverse direction.

Referring now to FIGS. 4 and 5, there is illustrated a variant form of the present invention having clamp means 30 which is essentially the same as that safety means illustrated at 29 as shown in FIG. 3. The clamp means 30 includes a pair of arcuate clamp members 31 and 31 connected to each other through a hinge 32, and drive means (not shown) for actuating the clamp members 31 and 31 either so as to be opened for disengagement as shown in FIG. 4 or so as to be shut for clamping the main rod section 4 therewith as shown in FIG. 5 corresponding to the progress of step of pulling the rod 10. The hinge 32 is fixedly secured to at least one of the respective inner surfaces of the shafts 27 and 27. After the stopper section 11 was formed at the top portion of the main rod section 4, the shaft 27 having the clamp means 30 is preferably moved downwardly so that the clamp means 30 can be situated at a position lower than the stopper section 11, and then the clamp means 30 is elevated upwards with a speed corresponding to a speed of elevating the shaft 27.

Referring to FIGS. 6, 7 and 8, there is illustrated a method of preparing the rod 10 as described above in FIG. 2, using the apparatus shown in FIG. 3.

First of all, the crucible 21 is filled with a silicon material in the form of lumps, and the crucible 21 is heated by the resistance heater 24 to a melting point of the silicon material or beyond at temperature. Thus, the material contained in the crucible 21 becomes molten when heated, and the melt 22 is heated continually so as not to be cooled.

On the other hand, the seed crystal 1 is supported through the supporting means 25 by the wire 28 as shown in FIG. 6.

Subsequently, the wire 28 is moved downwardly until the lower end of the seed crystal 1 is dipped into the melt 22, and then the wire 28 is gradually elevated upwards while rotating it, so that the lower end of the seed crystal 1 is pulled out from the surface of the melt 22.

In the step of pulling the rod 10, only the speed of the pulling the seed crystal 1 is increased while maintaining the temperature of the melt 22 at a constant level, so that the neck section 3 following the lower end of the seed crystal 1 is grown so as to be smaller in diameter than the seed crystal 1 as shown in FIG. 7. Next, the speed and temperature of the melt 22 are gradually decreased, so that the shoulder section 5 following the neck section 3 is grown so as to be larger in diameter gradually. The crystal growth under the condition above is continued until the diameter of the rod is sufficiently larger than the required diameter. Thus, the stopper section 11 is formed at the lower portion of the shoulder section 5 in FIG. 8. After the formation of the stopper section 11, the speed is increased again, so that the diameter of the portion is similar to the required diameter. When the diameter of the portion was equal to the required diameter, the speed is decreased from the high level to the low level, and the low speed is maintained in order to keep the diameter of the rod 4 constant.

Referring to FIG. 9, there is illustrated another preferred method according to the present invention. The rod 4 can be pulled upwards with supporting the seed crystal 1 and the stopper section 11 together. Namely, the seed crystal 1 is supported by the wire 28, and the stopper section 11 is directly supported by the safety sections 29 and 29 of the shafts 27 and 27, since the shaft 27 and the wire 28 are elevated upwards with the same speed together. In this method, the rod 10 which is heavier and longer than even can be pulled continuously.

The present invention will now be described in more detail by way of the following example.

EXAMPLE

There was prepared a quartz crucible 21 of 16 inches in diameter, and the crucible 21 was arranged in the susceptor 23, and then the crucible 21 was filled with 50 kg of lump silicon material. Subsequently, the air in the furnace was purged and replaced by argon gas, and an electric power 80 kW was applied to the resistance heater 24 and the susceptor 23 was heated to about 1550° C. As a result, the silicon material contained in the crucible 21 became molten, and the melt 22 was obtained.

On the other hand, there was prepared a seed crystal 1 of 10 mm in diameter, and the seed crystal 1 was supported through the supporting means 25 by the wire 28.

Subsequently, the wire 28 was moved downwardly until the lower end of the seed crystal 1 was dipped into the melt 22. Then the wire 28 was elevated upwards at a rate of 3 to 4 millimeters a minute while rotating it at 20 rpm, so that the seed crystal 1 could be pulled out from the surface of the melt 22. Also, the crucible 21 was rotated at 10 rpm. The crucible 21 and the seed crystal 1 were rotated in opposite direction to each other. Thus, the neck section 3 was formed 1 mm in diameter and 30 mm in length.

Further, the speed of pulling the seed crystal 1 was gradually decreased to a rate of 0.3 mm a minute and also the temperature of the melt 22 was decreased to a lower level in order to grow the shoulder section 5 following the neck section 3. This step was continued until the diameter of the lower end of the shoulder section 5 become by 10 mm larger in diameter than 100 mm.

Subsequently, the pulling speed was increased again to a rate of 3 to 4 mm a minute so as to prevent further increase in the diameter of the rod 4, so that the diameter of the portion was similar to 100 mm. When the diameter was equal to 100 mm, the speed was decreased again to a rate of about 1.5 mm a minute. Thus, the stopper section 11 was formed at the lower end of the shoulder section 5, and the shoulder section 5 formed was 8 mm in length. The pulling speed was kept in order to grow the rod section 4 following the stopper section 11, and the pulling operation was continued until the main rod 4 section of 100 mm in diameter was 500 mm in length.

Subsequently, the safety sections 29 and 29 of the shafts 27 and 27 were situated by 30 mm below the stopper section 11 so as to surround the rod 10, and then the shafts 27 and 27 were elevated upwards with the same speed as the speed of elevating the wire 28. When the rod 10 was grown to about 720 mm in length, the neck section 3 was damaged, and then the rod 10 was fallen downwardly. However, the rod 10 fallen was stopped by the stopper section 11, and accordingly the lower portion of the apparatus 20 including the crucible 21 made of quartz, the susceptor 23 made of graphite, the wire (not shown) disposed in the lower the apparatus, and the resistance heater 24 made of graphite or the like was not destroyed entirely.

While the method according to the present invention has been specifically shown and described herein, many modifications and variations are possible in the light of the above teachings.

What is claimed is:

1. A silicon monocrystal rod pulled from a melt, said rod having a circular cross section and including a neck section which is smaller in diameter than seed crystal, a main rod section which is formed integrally with the neck section and is larger in diameter than said neck section, a shoulder section which is tapered for linking said neck section to said main rod section and has the same diameter as said neck section on one end and has the same diameter as said main rod on the other end, and a stopper section provided at a top portion of said main rod section, said stopper section being larger in diameter than said main rod section.

2. A silicon monocrystal rod according to claim 1, in which said diameter of said stopper section is between about 6 mm plus the diameter of said main rod section and about 6 mm plus the radius of said main rod section plus the said diameter of said main rod section.

* * * * *